United States Patent [19]

Castera et al.

[11] 4,364,013
[45] Dec. 14, 1982

[54] MAGNETIC TRANSDUCER COMPRISING A STRAINED MAGNETIC WIRE IN A RIGID SHEATH OF NON-MAGNETIC MATERIAL

[75] Inventors: Jean P. Castera; Jean M. Dupont, both of Paris, France

[73] Assignee: Thomson-CSF, Paris, France

[21] Appl. No.: 149,317

[22] Filed: May 13, 1980

[30] Foreign Application Priority Data

May 16, 1979 [FR] France ............................... 79 12459

[51] Int. Cl.³ .................... G01R 33/00; G01N 27/72; G01B 7/14
[52] U.S. Cl. .................................. 324/260; 324/225; 324/207
[58] Field of Search ............... 324/207, 208, 225, 226, 324/173, 174, 260; 310/155, 168; 307/106, 414, 415, 419; 361/240

[56] References Cited

U.S. PATENT DOCUMENTS

| 3,602,906 | 8/1971 | Wiegand | 307/419 |
| 3,780,313 | 12/1973 | Wiegand | 324/174 |
| 3,855,525 | 12/1974 | Bernin | 324/208 |

*Primary Examiner*—Gerard R. Strecker
*Assistant Examiner*—Walter E. Snow
*Attorney, Agent, or Firm*—Oblon, Fisher, Spivak, McClelland & Maier

[57] ABSTRACT

A magnetic transducer is disclosed which utilizes the magnetostrictive effect for creating an easy axis of magnetization in the longitudinal axis of a magnetic wire having a high cobalt content by bending the wire, which is then placed in a non-magnetic hollow tube. This tube is placed in the axis of a detection coil. The application of a magnetic field, alternately in one direction and the other in the longitudinal axis of the assembly creates a flux variation due to the magnetization change in the easy axis. The pulses detected have a high amplitude and a low rise time.

7 Claims, 9 Drawing Figures

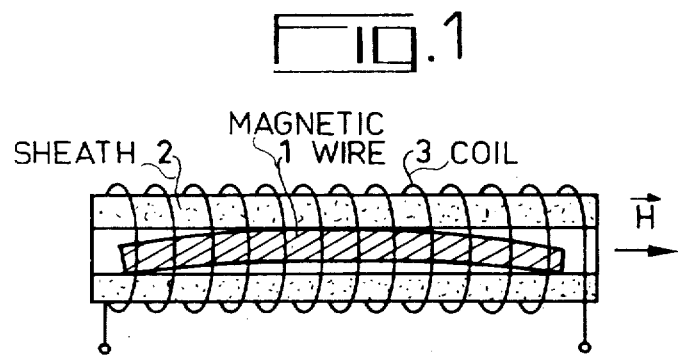
Fig.1
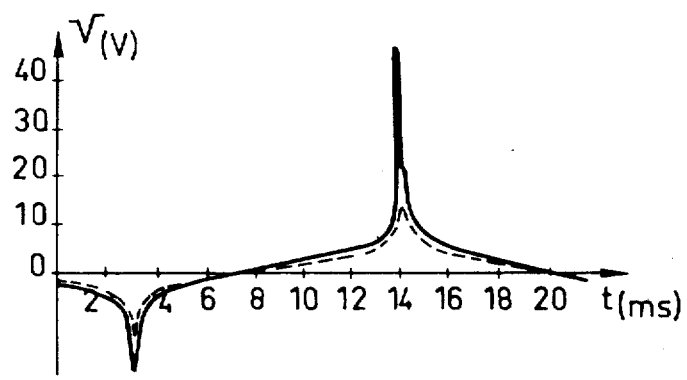
Fig.2
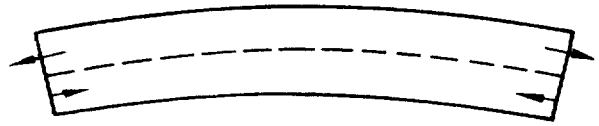
Fig.3-a
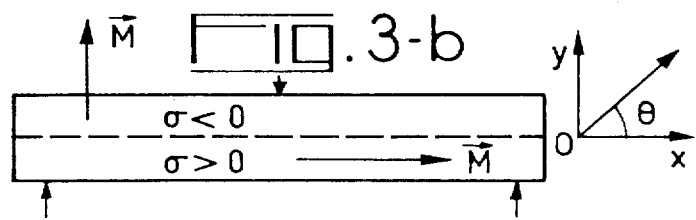
Fig.3-b

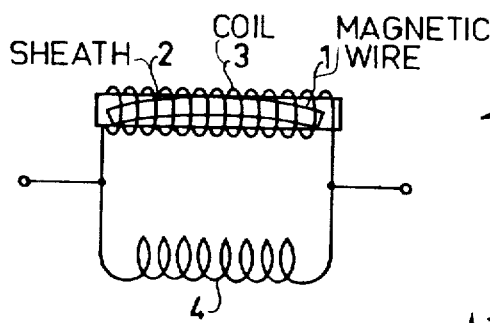
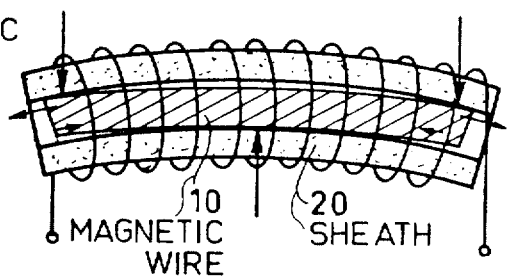
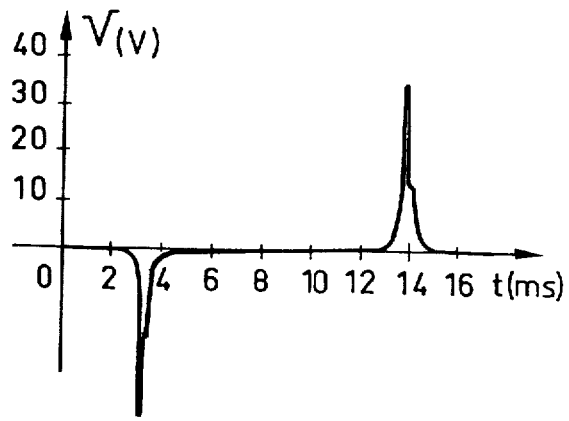
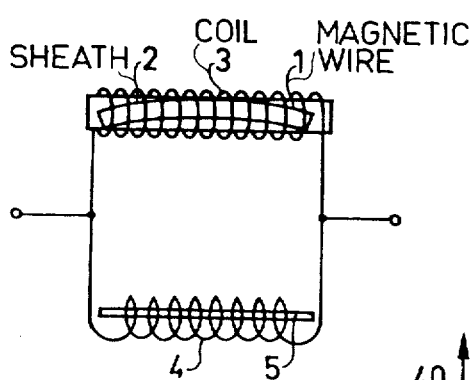
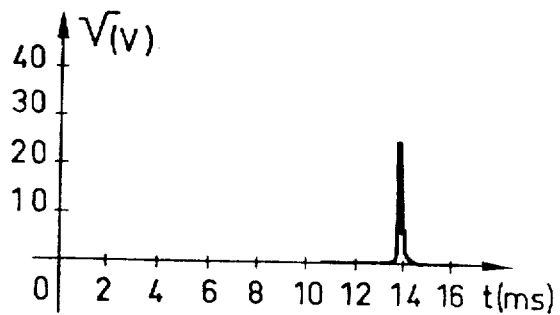

MAGNETIC TRANSDUCER COMPRISING A STRAINED MAGNETIC WIRE IN A RIGID SHEATH OF NON-MAGNETIC MATERIAL

BACKGROUND OF THE INVENTION

The invention relates to magnetic transducers using the magnetostrictive effect for creating an easy axis of permanent magnetization in a material. This magnetization is able to change under the action of an external magnetic field to be detected.

A magnetic transducer of the type briefly described hereinbefore has already been described. This transducer incorporates a wire formed from a special nickel-iron alloy (permalloy). This wire undergoes a complex treatment giving it special properties as regards to its magnetization and the wire can then be used as a magnetic transducer. This treatment consists of drawing the wire and then twisting it a certain number of times, whilst fixing one end. The other end is then turned in one direction and then in the other direction. At the end of this treatment, it is found that when the wire is placed within a coil and a magnetic field acts on the wire, a pulse can be detected at the coil terminals. This pulse is due to the change in the magnetization created within the wire by the converse magnetostrictive effect as a result of strains applied to the wire. As a result of the treatment applied to the wire, a strong coercive force $h_c$ is created in the area where the wire was strained, i.e. on the wire periphery. The coercive field $h_c$ in the wire core is much lower. When a magnetic polarization field is applied to the wire, magnetization is created which remains after removing the polarization field. Thus, a demagnetizing field is created which, if it is higher than the coercive field in the core of the material, but lower than the coercive field on the periphery of the material, leads to a resultant magnetization whose direction is different in the interior and on the periphery of the wire. When such a wire is placed in a coil and exposed to an external magnetic field which is higher than the demagnetizing field, the core magnetization is changed. When the external field disappears, the magnetization changes back in the other direction.

In such a transducer, only part of the material contributes to the variations in the magnetic flux during the change of the magnetization, due to the fact that the magnetization of the material periphery is already the same as that resulting from the change.

Moreover, the amplitude of the pulses detected is relatively low, approximately 1 volt when the input impedance of the detection system is 10 kΩ. In addition, this amplitude varies significantly from one change to the next, it being a function of the magnetization quantity subject to the change, which is itself a function, inter alia, of the number of regions which automatically re-changed at the end of the previous phase. Finally, the pulse rise time is relatively long and approximately 100 μs. When such a transducer is used as a position transducer, for example with the object of measuring the rotational speed of a motor, it is necessary that the motor blades do not pass in the vicinity of the transducer at times which are too close together. Thus, such a device, taking account of the pulse rise time s obtained, does not make it possible to measure rapid speeds. Moreover, as the amplitude of the detected pulses is relatively low it is absolutely indispensible to amplify them before using them for example in a counting circuit, which makes additional processing necessary.

BRIEF SUMMARY OF THE INVENTION

The invention relates to a magnetic transducer using converse magnetostrictive effects making it possible to obtain, following a momentary application of the magnetic field, a high amplitude, low rise time signal, said amplitude and said rise time being substantially independent of the operating conditions and in particular of the speed of applying the excitation magnetic field and the temperature.

The invention relates to a magnetic transducer wherein it comprises a magnetic wire introduced into a rigid sheath of non-magnetic material, the respective shapes of the wire and sheath being such that the wire in its sheath is kept bent, thus creating longitudinal strains so as to produce in one area of the wire an easy direction of magnetization in accordance with the longitudinal axis of the wire, the magnetic wire-sheath assembly being positioned in accordance with the axis of a detection coil which is to supply pulses during the momentary application of the magnetic field to the transducer, when said field induces a change to the magnetization in the magnetic wire from one direction to the other in accordance with the easy direction of magnetization.

BRIEF DESCRIPTION OF THE DRAWINGS

The invention is described in greater detail hereinafter relative to non-limitative embodiments and the attached drawings, wherein show:

FIG. 1 a first embodiment of the magnetic transducer according to the invention.

FIG. 2 the signal detected at the terminals of the coil of such a transducer.

FIGS. 3a and 3b more detailed diagrams of the magnetic wire used in the magnetic transducer according to the invention.

FIG. 4 a second embodiment of the transducer according to the invention.

FIG. 5 the signal detected at the terminals of the transducer shown in FIG. 4.

FIG. 6 a further embodiment of the magnetic transducer according to the invention.

FIG. 7 the signal detected at the terminals of the transducer shown in FIG. 6.

FIG. 8 another embodiment of the transducer according to the invention.

DETAILED DESCRIPTION OF THE PREFERRED EMBODIMENTS

The magnetic transducer according to the invention shown in FIG. 1 comprises a magnetic wire 1 having a high cobalt content. This wire can for example be formed by an alloy of composition 48.3% cobalt, 48.6% iron, 2.75% vanadium and 0.35% manganese. This wire can have a diameter of 0.5 mm. This wire which, after manufacture, is available in linear portions, is subject to a simple treatment consisting of winding it onto a reel so as to bend it and the deformation obtained (flexion) is permanent. A piece of this wire is then cut off and introduced into a rigid tube 2 forming a sheath, which is made from a non-magnetic material, such as glass, alumina, etc. As a non-limitative example, the wire can have a length of 20 mm and can be introduced into a tube, whose internal diameter is 1 mm. Under these conditions, the wire placed in the tube is subject to straining and its two ends bear on the inner face of the tube, due to the permanent curvature imposed on it beforehand. The assembly is placed in a coil 3 of conductive wire following the axis of said coil.

Due to the treatment undergone by the wire experience shows that in one area of the wire an axis of easy magnetization is created along the longitudinal axis. The application of a magnetic field $\vec{H}$ parallel to this axis leads to a change within this area to the magnetization regions not oriented in the field direction. This change corresponds to a variation in the magnetic flux which induces a signal at the terminals of the detection coil 3. When the magnetic field changes direction, the magnetization changes back and induces another flux variation. The signal detected at the terminals of the detection coil is shown in FIG. 2. In the case of the numerical values indicated hereinbefore, and with a coil having 17400 turns, the detected signal has a pulse, whose duration is equal to 30 microseconds and the rise time is approximately 20 microseconds. The shape and amplitude of this pulse are substantially independent of the speed of application of the external magnetic field and its amplitude. However, said amplitude must exceed the necessary threshold value for producing the change in the magnetization from one direction of easy magnetization to the other. In the drawing, the signal obtained by means of an identical device, but which has an unstrained wire, is shown in dotted line form. This signal does not have the narrow high amplitude pulse of the signal detected by means of the transducer incorporating a treated, strained wire. The numerical values given in FIG. 2 correspond to an input impedance of the measuring device equal to 1 M$\Omega$ (input impedance of the oscilloscope used). On using a processing circuit with an input impedance of 10 k$\Omega$ the amplitude of the pulses must be made 5 V, i.e. the active logic level of conventional logic circuits. Consequently, the signal obtained can be directly processed without being amplified beforehand.

FIGS. 3a and 3b are explanatory diagrams used in order to approximate to the phenomena occurring in the magnetic wire.

As a result of the initial treatment of the magnetic wire, two zones defined by a median plane orthogonal to the radius of curvature are created in said wire. In one of them, bending has led to an elongation of the wire and in the other the bending has led to a reduction in the length of the wire, these deformations being accompanied by radial deformations (FIG. 3a). When the wire is introduced into the tube, it tends to straighten itself out due to the small internal diameter of the tube compared with the bent wire. This imposes positive strains (tension) on it in the previously compressed zone and negative strains (compression) in the other zone (FIG. 3b). There are also other stresses in the material (shear). As the alloy contains a high proportion of cobalt, and as this has a very high positive magnetostrictive coefficient, the alloy itself has a high positive magnetostrictive coefficient $\lambda$.

The total energy of the system is equal to the sum of the magnetic energies of different types in the system $\Sigma E_m$ and the energy induced by the converse magnetostrictive effect by the strains applied E$\sigma$.

In a thin layer, said energy E$\sigma$ varies in accordance with $\sigma \cdot \lambda \cdot \sin^2 \theta$, in which $\sigma$ is a coefficient representing the strains, $\theta$ is the angle between the longitudinal axis of the wire Ox and the magnetization in the different regions. As has been stated hereinbefore, the wire can be divided with respect to the longitudinal strains into two zones, in one of which $\sigma$ is positive and in the other $\sigma$ is negative. In the tension zone, $\sigma > 0$, in order that the system tends towards a minimum energy state sin $\theta$ must tend towards O, i.e. the magnetization $\vec{M}$ has a tendency to orient itself in accordance with the longitudinal axis Ox of the wire, thus creating in said axis and said zone an axis of easy magnetization. In the compression zone $\sigma < 0$ in which the system tends towards a minimum energy state, sin $\theta$ must be maximum, i.e. $\theta = \pi/2$, i.e. the preferred axis of magnetization created in this zone in accordance with Oy is orthogonal to the longitudinal axis of the wire. Therefore, in said zone, the axis of the wire corresponds to an axis of difficult magnetization.

When a magnetic field is applied in accordance with this longitudinal axis, alternately in one direction followed by the other, the magnetization alternately changes in one direction and the other. The magnetization change from one direction to the other in this easy axis taking place rapidly and thus inducing a rapid variation of the flux and a high induced signal in the detection coil.

In addition to high amplitude pulses, due to this rapid change to the magnetization in the zone where the easy axis created in parallel to the wire, unwanted signals are also created. One varies slowly and corresponds to variations directly induced in the detection coil. The other is induced in the compressed area of the wire. Thus, although for this area the axis of the wire is a difficult axis of magnetization, when a magnetic field is applied in the axis of the wire a certain number of magnetic regions are aligned in this axis and this change creates a flux variation and consequently a detected signal. However, its amplitude is much lower and its rise time much higher than those of the pulse created by the change in the regions in the other area of the wire.

These two unwanted signals can be at least partly compensated. This is covered by the improvements described with reference to FIGS. 4 and 6, the corresponding detected signals being shown in FIGS. 5 and 7. The unwanted signal directly induced in the detection coil corresponding to slow variations of the signals shown in FIG. 2 can be compensated by means of a second coil connected to the terminals of the first and wound in the opposite direction. An external magnetic field induces in these two coils flux variations in opposite directions giving detected signals of opposite signs which compensate one another. FIG. 4 shows the magnetic transducer with a second coil 4. The corresponding detected signal shown in FIG. 5 now only has the pulses corresponding to the magnetization changes.

The unwanted signal induced by the compressed part of the wire can be partly compensated by adding an unstrained wire 5 forming a core in the previously described compensation coil 4. The resulting construction is shown in FIG. 6 and the corresponding detected signal is shown in FIG. 7.

Thus, in the transducer described hereinbefore, a state of strain continues to exist in the wire, at the same time as the permanent deformation due to the bending on the reel. When such a wire is introduced into a rigid straight sheath, the ends of the wire and its centre bear against the inner surface of the sheath and the thus applied strains are superimposed on those already existing in the wire.

Thus, it is possible to still further improve the performances by performing a stabilization annealing of the material, which eliminates the strains created by the initial deformation. The only strains in the wire are then due to the engagement thereof on the inner wall of the sheath.

Another embodiment of the transducer according to the invention is shown in FIG. 8. It incorporates a magnetic wire 10, which is not initially deformed, placed in a curved rigid sheath 20. Due to the curvature of the sheath, the wire introduced into it is bent on engaging with the inner face of the sheath (the engagement points are as in FIG. 3b). This bending leads to longitudinal strains, tension in one area and compression in the other, of the same type as obtained by means of a bent wire introduced into a straight sheath, where identical effects occur. In particular, an easy axis of magnetization is created along the axis of the wire in the tension area.

Wire 10 and its sheath 20 placed, as hereinbefore, in a detection coil 3 and the device operates in the same way. It is also possible to add to it a compensation coil 4, optionally provided with a core formed by an unstrained wire, so as to prevent the unwanted signals as described hereinbefore. In a more general manner, the magnetic transducer according to the invention incorporates a magnetic wire which is subject to longitudinal strains created in said wire by bending. Thus, an easy axis of magnetization is created in the area of the wire under tension in the longitudinal axis thereof. The magnetization is able to rapidly change direction with respect to this easy axis under the action of an external magnetic beam.

This transducer, which incorporates a magnetic wire which has previously undergone a relatively simple mechanical treatment, has very satisfactory performance characteristics and can be used in a large number of applications, e.g. for a moving element position transducer in translation or in rotation, provided that this displacement leads to a variation in the magnetic field. Such a transducer can also be used as a pulse generator associated with an element creating a variation in the magnetic field. Such a pulse generator can then be directly connected to the logic circuits used due to the fact that the amplitude of the output pulses with a matched load impedance can be 5 V. Moreover, the amplitude variations of these pulses do not exceed 10 to 15%, depending on the wire used, no matter what magnetic field value is used. However, this value must exceed the threshold value necessary for the magnetization change. These fluctuations can also be reduced when the magnetic field applied to the wire has a constant amplitude during the times when it is applied.

The invention is not limited to the embodiments of the transducer described hereinbefore. In particular, the composition of the magnetic wire which has been given in an exemplified manner, is in no way limitative and any other ferromagnetic wire having a high magnetostrictirve coefficient bent in such a way as to create therein longitudinal stresses makes it possible to supply pulses created at the terminals of the coil by a variation of the flux and due to the magnetization change during the application of a magnetic field. However, to obtain high amplitude pulses, it is advantageous to use a ferromagnetic wire having a high cobalt content due to the high magnetostrictive coefficient of the latter.

What is claimed is:

1. A magnetic transducer using a strained magnetic material responsive to a magnetic field parallel to the longitudinal axis of said transducer, said transducer comprising a magnetic wire introduced into a rigid sheath of nonmagnetic material, the respective shapes of the wire and sheath being such that wire in its sheath is kept bent, thus creating longitudinal strains so as to produce in one area of the wire an easy direction of magnetization in accordance with the longitudinal axis of the wire, the magnetic wire-sheath assembly being positioned in a detection coil along the longitudinal axis thereof, which is to supply pulses during the momentary application of said magnetic field to the transducer, when said field induces a change to the magnetization in the magnetic wire from one direction to the other in accordance with the easy direction of magnetization.

2. A magnetic transducer according to claim 1, wherein said magnetic wire comprises a ferromagnetic alloy having a high cobalt content.

3. A magnetic transducer according to claim 1, wherein the magnetic wire is mechanically treated in flexion until it has a permanent deformation, said wire being introduced into said sheath wherein said sheath is a straight sheath.

4. A magnetic transducer according to claim 3, wherein the magnetic wire is annealed before introduction into the sheath to eliminate the strains remaining in the wire following the permanent deformation.

5. A magnetic transducer according to claim 1, wherein the sheath is bent, the magnetic wire being straight before being inserted into it.

6. A magnetic transducer according to claim 1, wherein a second coil is mounted in opposition to the terminals of the first coil to compensate the detected signal component induced by the first coil during the application of a magnetic field to be detected.

7. A magnetic transducer according to claim 3, wherein a second wire of the same type as the first, but which is not strained, is placed in the axis of a second coil to partly compensate the detected signal component induced by the strained part of said strained wire in which the longitudinal strains create an easy axis of magnetization orthogonal to the longitudinal axis of said strained wire.

* * * * *